(12) United States Patent
Lin

(10) Patent No.: US 11,609,263 B2
(45) Date of Patent: Mar. 21, 2023

(54) FAILURE PATTERN OBTAINING METHOD AND APPARATUS

(71) Applicant: CHANGXIN MEMORY TECHNOLOGIES, INC., Hefei (CN)

(72) Inventor: Chiasheng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 104 days.

(21) Appl. No.: 17/389,594

(22) Filed: Jul. 30, 2021

(65) Prior Publication Data
US 2022/0026484 A1 Jan. 27, 2022

Related U.S. Application Data

(63) Continuation of application No. PCT/CN2020/136392, filed on Dec. 15, 2020.

(30) Foreign Application Priority Data

Jul. 27, 2020 (CN) .......................... 202010730179.1

(51) Int. Cl.
*G01R 31/28* (2006.01)
*G01R 31/3183* (2006.01)
*G06T 7/00* (2017.01)

(52) U.S. Cl.
CPC ..... *G01R 31/2831* (2013.01); *G01R 31/2834* (2013.01); *G01R 31/2891* (2013.01); *G01R 31/2896* (2013.01); *G01R 31/318335* (2013.01); *G06T 7/0006* (2013.01); *G06T 2207/10004* (2013.01)

(58) Field of Classification Search
CPC .. G01R 31/002; G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 6,274,394 B1 * | 8/2001 | Cha .................. | H01L 22/20 700/121 |
| 7,020,582 B1 * | 3/2006 | Dicosola ............ | G01R 31/2831 714/724 |
| 2003/0140294 A1 * | 7/2003 | Sagatelian ..... | G01R 31/318342 714/732 |
| 2013/0060505 A1 | 3/2013 | Brennan | |

FOREIGN PATENT DOCUMENTS

| | | |
|---|---|---|
| CN | 104483616 A | 4/2015 |
| CN | 104916559 A | 9/2015 |
| CN | 105224776 A | 1/2016 |
| CN | 110907796 A | 3/2020 |
| CN | 111046561 A | 4/2020 |

* cited by examiner

*Primary Examiner* — Tung X Nguyen
(74) *Attorney, Agent, or Firm* — Cooper Legal Group, LLC

(57) ABSTRACT

A failure pattern obtaining method and apparatus are provided. The method includes that: a chip test result picture for a wafer is obtained, the chip test result picture being marked with a plurality of failure test points; a vector for every two points among all failure test points is calculated; a plurality of failure test points having a same vector are designated as a same group; a plurality of pending failure patterns are separated from each of groups; a failure pattern is obtained based on the plurality of the pending failure patterns.

20 Claims, 3 Drawing Sheets

FAILURE PATTERN OBTAINING METHOD AND APPARATUS

CROSS REFERENCE TO RELATED APPLICATION

This is a continuation application of International Patent Application No. PCT/CN2020/136392, filed on Dec. 15, 2020, which claims priority to Chinese Patent Application No. 202010730179.1, filed on Jul. 27, 2020 and entitled "FAILURE PATTERN OBTAINING METHOD AND APPARATUS". The disclosures of International Patent Application No. PCT/CN2020/136392 and Chinese Patent Application No. 202010730179.1 are incorporated by reference in their entireties.

TECHNICAL FIELD

The present invention relates to the field of semiconductor testing, and more particularly, to a failure pattern obtaining method and an apparatus.

BACKGROUND

The manufacture procedure of an integrated circuit can generally be divided into wafer fabrication, wafer probe, packaging, and final test. Before chip packaging, circuit probe (CP) is usually performed on the integrated circuits of the wafer to determine whether the integrated circuits are good, and final test (FT) must be performed on the integrated circuits after the packaging process to screen out the defective products due to the poor packaging process, thereby further improving the yield of the finish goods. In the related art, a wafer test card with a plurality of probes is generally used, and it is determined whether electrical performance of an integrated circuit is good by contacting a probe of the wafer test card with the integrated circuit of a wafer and applying a test signal to the integrated circuit.

A wafer generally refers to a silicon wafer used for fabricating an integrated circuit. After fabrication of all integrated circuits on the wafer is completed, the wafer includes a plurality of dies, each of which corresponds to a chip, and each chip includes a large number of memory addresses. Electrical performance of the memory address in each chip on the wafer is tested during the CP of the wafer, and the memory address that does not meet the electrical performance requirement is marked as a failure memory address.

The testing accuracy of the existing method for electrical performance test of a wafer still needs to be improved.

SUMMARY

The technical problem to be solved by the invention is to improve the accuracy of the method for electrical performance test of a wafer.

The present invention provides a failure pattern obtaining method, which includes the following operations.

A chip test result picture for a wafer is obtained, the chip test result picture being marked with a plurality of failure test points.

A vector for every two points among all failure test points is calculated.

A plurality of failure test points having a same vector are designated as a same group.

A plurality of pending failure patterns are separated from each of groups.

A failure pattern is obtained based on the plurality of the pending failure patterns.

Optionally, the wafer has a plurality of chips, each of the chips having a plurality of memory addresses, and one of the chips having a respective chip test result picture.

Optionally, the operation that the chip test result picture is obtained may include the following operations. Electrical performance test is performed on each of the memory addresses in the chip to obtain a plurality of electrical test results. A row-column arranged picture is obtained by arranging the plurality of electrical test results according to the memory addresses. The row-column arranged picture is a chip test result picture, and one of the failure test points in the chip test result picture corresponds to one memory address.

Optionally, the operation that the chip test result picture is obtained may include the following operations. Electrical performance test is performed on each of the memory addresses in the chip to obtain a plurality of electrical test results. A row-column arranged picture is obtained by arranging the plurality of electrical test results according to the memory addresses. The compression is performed on the row-column arranged picture to obtain a compressed picture. The compressed picture is the chip test result picture, and one of the failure test points in the chip test result picture corresponds to multiple memory addresses.

Optionally, the compression is performed by compressing multiple adjacent electrical test results in the row-column arranged picture into a point. If one of the multiple electrical test results is a failure, a point formed after the compression is a failure test point.

Optionally, the vector is a two-dimensional coordinate vector or a polar coordinate vector.

Optionally, the vector is calculated by using a decentralized operation server configured with a pattern processor.

Optionally, the plurality of the pending failure patterns are separated from each of the groups by using a clustering algorithm.

Optionally, the operation that the failure pattern is obtained based on the plurality of the pending failure patterns may include the following operations. The number of occurrence times for each of the plurality of the pending failure patterns is calculated. The plurality of the pending failure patterns are sorted according to the number of the occurrence times from large to small. One or more pending failure patterns whose number of occurrence times is greater than or equal to 2 in the chip test result picture are taken as the failure pattern, or one or more pending failure patterns whose number of occurrence times are sorted in the top 40% are taken as the failure pattern.

Optionally, the method may further include the following operation. After obtaining the failure pattern, a test environment of respective test equipment is checked. The test environment includes a test program.

The present invention further provides a failure pattern obtaining apparatus, which includes a chip test result picture obtaining unit, a vector calculation unit, a group confirming unit, a pending failure pattern confirming unit and a failure pattern obtaining unit.

The chip test result picture obtaining unit is configured to obtain a chip test result picture for a wafer, the chip test result picture being marked with a plurality of failure test points.

The vector calculation unit is configured to calculate a vector for every two points among all of the failure test points.

The group confirming unit is configured to designate a plurality of failure test points having a same vector as a same group.

The pending failure pattern confirming unit is configured to separate a plurality of pending failure patterns from each of the groups.

The failure pattern obtaining unit is configured to obtain a failure pattern based on the plurality of the pending failure patterns.

Optionally, the wafer has a plurality of chips, each of the chips having a plurality of memory addresses, and one of the chips having a respective chip test result picture.

Optionally, the chip test result picture obtaining unit is configured to obtain the test result picture by: performing electrical performance test on each of the memory addresses in the chip to obtain a plurality of electrical test results; and obtaining a row-column arranged picture by arranging the plurality of the electrical test results according to the memory addresses. The row-column arranged picture is the chip test result picture, and one of the failure test points in the chip test result picture corresponds to one memory address.

Optionally, the chip test result picture obtaining unit is configured to obtain the test result picture by: performing electrical performance test on each of the memory addresses in the chip to obtain a plurality of electrical test results; obtaining a row-column arranged picture by arranging the plurality of the electrical test results according to the memory addresses; and performing compression on the row-column arranged picture to obtain a compressed picture. The compressed picture is the chip test result picture, and one of the failure test points in the chip test result picture corresponds to multiple memory addresses.

Optionally, the compression is performed by compressing multiple adjacent CP results in the row-column arranged picture into a point, and if one of the multiple electrical test results is a failure, a point formed after the compression is a failure test point.

Optionally, the vector is a two-dimensional coordinate vector or a polar coordinate vector.

Optionally, the vector calculation unit is a decentralized operation server configured with a pattern processor.

Optionally, the group confirming unit is configured to separate the plurality of pending failure patterns from each of the groups by using a clustering algorithm.

Optionally, the failure pattern obtaining unit is configured to obtain the failure pattern by: calculating a number of occurrences times for each of the plurality of the pending failure patterns; sorting the plurality of the pending failure patterns according to the number of the occurrence times from large to small; and taking one or more pending failure patterns whose number of occurrence times is greater than or equal to 2 in the chip test result picture as the failure pattern, or taking one or more pending failure patterns whose number of occurrence times are sorted in the top 40% as the failure pattern.

Compared with the prior art, the technical solution of the present invention has the following advantages.

According to the present invention, a failure pattern obtaining method includes the following operations. A chip test result picture for a wafer is obtained, the chip test result picture being marked with a plurality of failure test points; a vector for every two points among all failure test points is calculated; a plurality of failure test points having a same vector is determined as a same group; a plurality of pending failure patterns is separated from each of groups; and a failure pattern is obtained based on the plurality of the pending failure patterns. Through the above steps, a failure pattern can be accurately and rapidly obtained, and the failure pattern is used to determine whether the test equipment fails. If the failure pattern is obtained, it is determined that the test environment of the test equipment fails, and thus the tester can adjust the test environment of the test equipment (for example, modify the test program), so as to prevent the occurrence of misdetection of the test equipment, thereby improving the accuracy of the electrical test.

Further, the chip test result picture is obtained by: performing electrical performance test on each of the memory addresses in the chip to obtain a plurality of electrical test results; obtaining a row-column arranged picture by arranging the plurality of the electrical test results according to the memory addresses; and performing compression on the row-column arranged picture to obtain a compressed picture, where the compressed picture is the chip test result picture, and one of the failure test points in the chip test result picture corresponds to multiple memory addresses. In this way, the calculation amount of subsequent vector calculation is reduced and the electrical test efficiency is improved.

Further, calculation of the vector is performed by using a decentralized operation server configured with a pattern processor, which improves the speed and efficiency of the vector operation.

Further, the operation that the failure pattern is obtained based on the plurality of pending failure patterns includes the following operations. The number of occurrence times for each of the plurality of the pending failure patterns is calculated; the plurality of the pending failure patterns are sorted according to the number of the occurrence times from large to small; and one or more pending failure patterns whose number of occurrence times is greater than or equal to 2 in the chip test result picture are taken as the failure pattern, or one or more pending failure patterns whose number of occurrence times are sorted in the top 40% are taken as the failure pattern. In this way, efficiency and accuracy of determining the failure patterns is improved.

DETAILED DESCRIPTION

As described in the background, the testing accuracy of existing method for electrical performance test of a wafer remains to be improved.

It has been found that further inspection of the existing electrical test results of wafers shows that not every chip in the failed chips marked is invalid, and that the electrical performance of some of the failed chips still meets the performance requirements, that is, these failed chips were obtained due to misdetection.

It has further been found that these misdetected failed chips present on the wafer in a regular arrangement. Further research has found that these misdetected failed chips are caused by the test environment (for example, test program) of the test equipment.

To this end, the present invention provides a failure pattern obtaining method and apparatus. The failure pattern obtaining method includes the following operations. A chip test result picture for a wafer is obtained, the chip test result picture being marked with a plurality of failure test points. A vector for every two points among all failure test points is calculated. A plurality of failure test points having a same vector is determined as a same group. A plurality of pending failure patterns is separated from each of the groups. A failure pattern is obtained based on the plurality of the pending failure patterns. Based on the forgoing steps, the failure pattern can be accurately and rapidly obtained, and the failure pattern is used to determine whether the test equipment fails. If the failure pattern is obtained, it is determined that the test environment of the test equipment fails, and thus the tester can adjust the test environment of the test equipment (for example, modify the test program), so as to prevent the occurrence of misdetection of the test equipment, thereby improving the accuracy of the electrical test.

In order to make the above objects, features and advantages of the present invention more clear and understandable, embodiments of the present invention will be further described in detail in combination with the accompanying drawings below. In describing embodiments of the present invention in detail, for ease of explanation, the schematic diagram is not partially enlarged in general scales, and the schematic diagram is merely an example and should not be construed to limit the scope of the present invention. In addition, three-dimensional space dimensions of length, width and depth should be included in the actual fabrication.

Hereinafter, a failure pattern obtaining method according to an embodiment of the present invention will be described in detail with reference to FIGS. 1 to 5.

Figure 1:
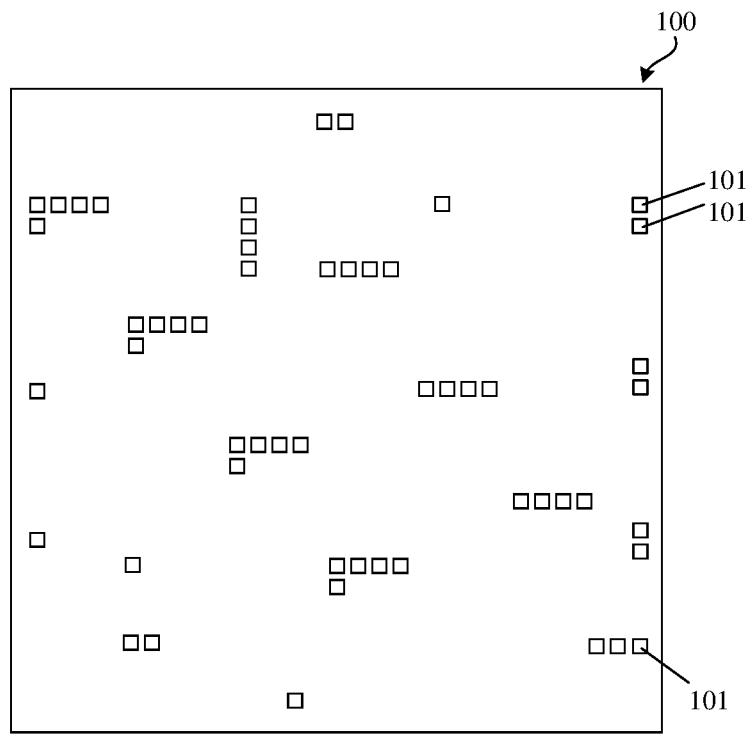
FIGS. 1 to 5 are schematic structural diagrams of a process for obtaining a failure pattern according to an embodiment of the present invention.

Referring to FIG. 1, a chip test result picture 100 of a wafer is obtained, the chip test result picture 100 being marked with a plurality of failure test points 101, i.e., chips.

The wafer has a plurality of chips, each of the chips having a plurality of memory addresses, and one of the chips having a respective chip test result picture. The chip may be a memory chip, and the memory chip has a memory array. The memory array has a plurality of memory units arranged in an array, each memory unit having a respective memory address, and a write, read or erase operation can be performed on the respective memory unit according to the memory address. In a particular embodiment, the chip may be a volatile memory chip, including a random-access memory (RAM), a dynamic random-access memory (DRAM), a static random-access memory (SRAM), etc., and the chip may be a non-volatile memory chip, including NAND flash memory, ONR flash memory, or resistance variable memory. In other embodiments, the chip may also be a non-memory chip, such as a logic chip.

The chip test result picture 100 of the wafer is a distribution diagram corresponding to one or more memory addresses whose electrical test result fails after electrical performance test is performed on the chips in the wafer. When obtaining the failure pattern, the number of the chip test result picture 100 of the wafer may be one or more. When obtaining the chip test result picture 100 of the wafer, electrical performance test is performed on each of memory addresses in the chip.

In an embodiment, the operation that the chip test result picture 100 is obtained includes: providing a wafer on which a plurality of chips are formed; The obtaining of the chip test result picture includes: performing electrical performance test on each of the memory addresses in the chip to obtain a plurality of electrical test results; obtaining a row-column arranged picture by arranging the plurality of electrical test results according to the memory addresses. The row-column arranged picture is a chip test result picture, and one of the failure test points in the chip test result picture corresponds to one memory address.

The electrical performance test may be circuit probe (CP) or final test (FT). When performing the electrical performance test, the electrical performance test is performed on each of the memory addresses on the chip. After the electrical performance test, a row-column arranged picture is obtained according to the electrical test result. The row-column arranged picture corresponds to memory addresses on the chip, that is, each of the memory addresses on the chip has a display point of a test result at a corresponding position on the row-column arranged picture. Specifically, if the electrical test result of one memory address meets the electrical performance requirement, the memory address is considered to be a normal memory address and is marked as a normal point or unmarked at the corresponding position on the row-column arranged picture. If the electrical test result of one memory address does not meet the electrical performance requirement, the memory address is considered to be a memory address whose electrical performance test fails, and is marked as a failure point at the corresponding position on the row-column arranged picture. The memory address whose electrical performance test fails includes a misdetection memory address caused by the test environment of the test equipment. In one embodiment, the obtained row-column arranged picture is directly taken as the chip test result picture 100, a normal point in the row-column arranged picture is taken as a normal test point in the chip test result picture 100, and a failure point in the row-column arranged picture is taken as a failure test point in the chip test result picture 100.

It has been found that because the number of memory addresses in a chip is very large (which may be millions, tens of millions or hundreds of millions), if the obtained row-column arranged picture is directly taken as the chip test result picture 100, then the calculation amount in the subsequent calculation of vectors will be very large, which reduces the efficiency of obtaining the failure pattern. Moreover, the misdetection caused by the test environment of the test equipment will have a certain repeatability. Therefore, in another embodiment, the chip test result picture 100 is obtained by performing electrical performance test on each of the memory addresses in the chip to obtain a plurality of electrical test results; obtaining a row-column arranged picture by arranging the plurality of electrical test results according to the memory addresses; performing compression on the row-column arranged picture to obtain a compressed picture. The compressed picture is the chip test result picture, and one of the failure test points in the chip test result picture corresponds to multiple memory addresses. In this way, the calculation amount of subsequent calculation of the vector is reduced and test efficiency is improved.

In an embodiment, the procedure of the compression includes: compressing multiple adjacent electrical test results in the row-column arranged picture into a point, where if one of the multiple electrical test results is a failure, a point formed after the compression is a failure test point. Specifically, the row-column arranged picture has a plurality of normal points and/or failure points corresponding to a plurality of memory addresses, and the plurality of normal points and/or failure points are arranged in a row-column manner. In compression, all the points in the N*M matrix are compressed into one point, where N is equal to or not equal to M, $2 \leq N \leq 1000$, $2 \leq M \leq 1000$. If there is at least one failure point in the N*M matrix, a point formed after compression of the N*M matrix is marked as a failure test point. If there is no failure point in the N*M matrix, a point formed after compression of the N*M matrix is marked as a normal test point. In a specific embodiment, for example, a chip has $2^{30}$ memory addresses, which, after compression, corresponds to only 6000-10000 memory addresses. In other embodiments, the compression may be implemented using other manners.

In a specific embodiment, the electrical performance test process is performed on the existing test equipment, and the chip test result picture may be obtained by performing a corresponding picture process on the chip test result by the existing test equipment.

In the embodiment, the obtained chip test result picture 100 is shown in FIG. 1. The chip test result picture 100 is a compressed picture, in which each of the failure test points 101 corresponds to multiple memory addresses on the chip. In FIG. 1, the outer frame refers to the outline of a chip, and each small block refers to a failure test point 101. Since the normal test point does not participate in the subsequent calculation in order to reduce the interference of the subsequent calculation and improve the accuracy of calculation, the normal test point is marked with blank on the chip test result picture 100. In other embodiments, the failure test points on the chip test result picture 100 may be marked with other patterns or using grayscale. It should be noted that the chip test result picture 100 shown in FIG. 1 serve as one example only for convenience of describing the solution of the present invention, and should not limit the scope of the present invention.

Figure 2:
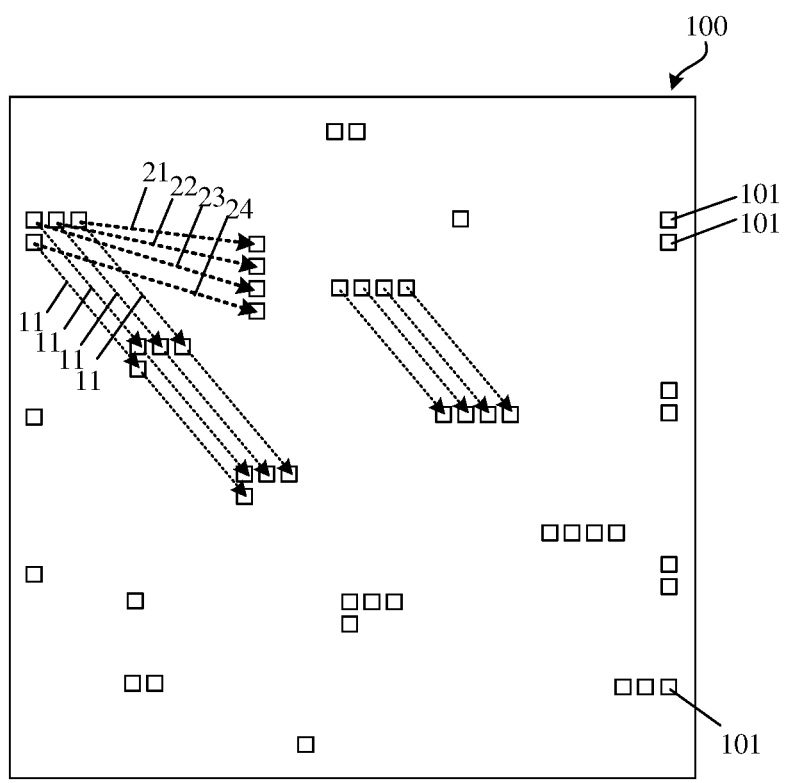

Referring to FIG. 2, a vector for every two points among all failure test points 101 is calculated.

A vector is determined between every two failure test points 101 in all failure test points 101 (where the vector represents the direction and distance between two failure test points 101), and thus each failure test point 101 has multiple vectors relative to other failure test points 101 in the chip test result picture 100, i.e., each of the failure test points 101 corresponds to multiple vectors. For example, when there are 800 failure test points 101 on the chip test result picture 100, at most 799 vectors can be obtained for each failure test point 101.

FIG. 2 illustrates partial vectors corresponding to partial failure test points 101, for example, dashed arrows 11, 21, 22, 23, 24 represents vectors corresponding to some failure test points 101 in FIG. 2.

When the vector calculation is performed, a two-dimensional coordinate system or a polar coordinate system may be used. Therefore, a vector is calculated as a two-dimensional coordinate vector or a polar coordinate vector.

In an embodiment, the vector is calculated by using a decentralized operation server configured with a pattern processor. That is, the chip test result picture is processed by multiple operation servers in parallel, which further improves the speed and efficiency of the vector calculation.

Figure 3:
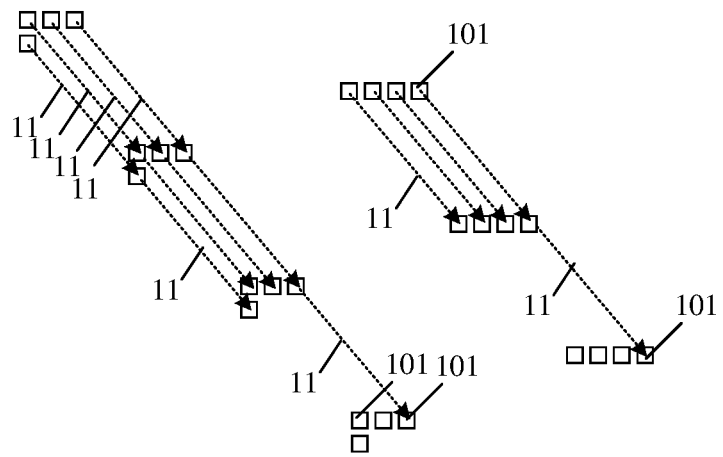
Figure 4:
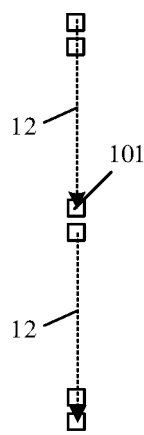

Referring to FIGS. 3 and 4, a plurality of failure test points having a same vector are determined as a same group and a plurality of groups are obtained.

The same vector is a vector with the same direction and the same distance.

Since the vector calculation is performed on each of the failure test points 101 on the chip test result picture 100, although each failure test point 101 will have respective multiple vectors, as long as a failure test point 101 has the same vector with other test point 101, then the failure test points having the same vector are determined as the same group. The plurality of failure test points 101 on the chip test result picture 100 may define many groups.

In an embodiment, when defining the same group, each of the failure test points 101 having the same vector on the chip test result picture 100 is marked with the same group marker, and different groups are marked with different group markers, specifically with letters, characters, numbers or a combination thereof. For example, letters A, B, C, etc. can be used to represent different groups, and group 1, group 2, and group 3 can be used to represent different groups.

In other embodiments, it is also possible to extract or segment each of the failure test points 101 having the same vector on the chip test result picture 100 as a group, the position of the extracted or segmented failure test point 101 corresponds to the position of the failure test point on the chip test result picture 100. FIGS. 3 and 4 show different groups determined according to the failure test points 101 having the same vector in FIG. 2. FIG. 3 shows group 1, and FIG. 4 shows group 2. A plurality of failure test points 101 in the group 1 have the same first vector 11 in FIG. 3, and a plurality of failure test points 101 in the group 2 have the same second vector 12 in FIG. 4. It should be noted that the groups shown in FIGS. 3 and 4 are illustrative only and should not limit the scope of the present invention.

Figure 5:
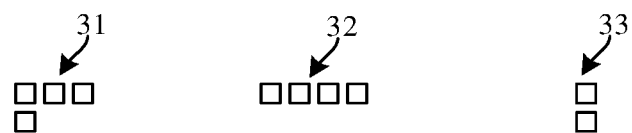

Referring to FIG. 5, a plurality of pending failure patterns are separated from each of the groups.

A plurality of groups are determined in the above step, each of which has a plurality of failure test points 101 having the same vector. One failure test point 101 in each of the groups may be independently distributed or may be concurrently adjacent to a plurality of other failure test points 101. A plurality of adjacent failure test points may form a respective pattern.

In the embodiment, the plurality of the pending failure patterns are separated from each of the groups by using a clustering algorithm. FIG. 5 illustrates three pending failure patterns separated from group 1 in FIG. 3 and group 2 in FIG. 4, including a first pending failure pattern 31, a second pending failure pattern 32, and a third pending failure pattern 33.

The clustering algorithm may be, for example, K-MEANS algorithm, K-MEDIODS algorithm, Clara algorithm, Clarans algorithm, and the like.

In the embodiment, the K-MEANS algorithm is used as the clustering algorithm and the specific steps are as follows.

(1) A plurality of failure test points 101 in a group are set as a point set S, and the point set S is divided into K categories of S_1, S_2, . . . , S_K, where each category of S_1, S_2, . . . , S_K represents a respective pending failure pattern.

(2) The value of K is set, and K points are randomly selected as K initial center points respectively.

(3) The distance from each of failure test points to the K center points is calculated respectively, a center point closest to the failure test point is selected and divided into a group centered at the selected center point.

(4) Center points of the K groups are re-calculated respectively.

(5) If the center points are unchanged, the K-MEANS process ends. Otherwise, step (3) and (4) are performed repeatedly.

After a plurality of the pending failure patterns are separated from each of the groups, the method further includes: obtaining one or more failure patterns based on the plurality of the pending failure patterns.

The failure pattern is determined on the basis that one or more pending failure patterns with more occurrence times are used as failure patterns.

Specifically, in an embodiment, the operation that one or more failure patterns are obtained based on the plurality of the pending failure patterns includes the following operations. The number of occurrence times for the plurality of the pending failure patterns is calculated. The plurality of the pending failure patterns are sorted according to the number of the occurrence times from large to small. One or more pending failure patterns whose number of occurrence times is greater than or equal to 2 in the chip test result picture are taken as the failure pattern, or one or more pending failure patterns whose number of occurrence times are sorted in the top 40% are taken as the failure pattern. In this way, the efficiency and accuracy of determining the failure patterns are improved.

In a specific embodiment, one or more pending failure patterns whose number of the occurrence times is 3, 4, 5, 7, 8, 9, 10, 20, 50, 100, 1000 may be taken as the failure patterns. In the embodiment, a pending failure pattern whose occurrence times is greater than or equal to 4 is used as the failure pattern. Referring specifically to FIG. 5, the first pending failure pattern 31 appears for 4 times in FIG. 5, and the first pending failure pattern 31 is taken as the failure pattern. In other embodiments, the number of occurrence times may be reasonably set according to actual conditions.

In another embodiment, one or more pending failure patterns whose number of occurrence times are sorted in the top 40%, 20%, 10%, 8%, 6% or 5% are taken as the failure pattern. Specifically, with continuing reference to FIG. 5, it is assumed that the three pending failure patterns (i.e., the first pending failure pattern 31, the second pending failure pattern 32, and the third pending failure pattern 33) shown in FIG. 5 are separated from the groups corresponding to a plurality of chips, the number of occurrence times corresponding to the first pending failure pattern 31, the second pending failure pattern 32 and the third pending failure pattern 33 are obtained respectively. For example, the first pending failure pattern 31 appears for 50 times, the second pending failure pattern 32 appears for 30 times, and the third pending failure pattern 33 appears for 20 times. Three pending failure patterns are sorted according to the number of the occurrence times from large to small. The first pending failure pattern 31 is sorted in the top 40% and is taken as the failure pattern. In other embodiments, the percentage may be reasonably set according to actual conditions.

Because the misdetection of electrical performance of the test equipment (e.g., testing a normal memory address as the failure memory address) caused by the test environment has a certain rule, a failure pattern can be accurately and quickly obtained by the foregoing steps in the present application, and the failure pattern is used to determine whether the test equipment fails. If the failure pattern is obtained, it is determined that the test environment of the test equipment fails, and thus the tester can adjust the test environment of the test equipment (for example, modify the test program), so as to prevent the occurrence of the misdetection of the test equipment, thereby improving the accuracy of the electrical test.

An embodiment of the present invention further provides a method of monitoring test equipment, which includes the following operations.

A failure pattern is obtained using the method described in the foregoing embodiments.

Electrical performance test is performed on each of the memory addresses in a to-be-tested chip to obtain a chip test result picture corresponding to the to-be-tested chip.

It is determined whether a failure pattern exists on the chip test result picture corresponding to the to-be-tested chip, and if the failure pattern exists, the test environment of the test equipment is checked.

The obtained failure pattern may be stored in an empirical database of the test equipment, and according to the foregoing failure pattern obtaining method, different to-be-tested wafers on the production line may be selected as chips in real time or at an irregular time. Therefore, the failure pattern may be updated in real time, periodically or at an irregular time, which further improves the efficiency of monitoring the test equipment and the accuracy of the electrical test.

In an embodiment, whether a failure pattern exists on the chip test result picture corresponding to the to-be-tested chip may be determined by matching a pattern on the chip test result picture corresponding to the to-be-tested chip with the failure pattern.

The test environment includes a test program.

The operation that the test environment of the test equipment is checked includes that the test program is modified. It should be noted that the definition or description of the same or similar parts of the embodiment (the method for monitoring the test equipment) and the previous embodiment (the failure pattern obtaining method) will not be elaborated in the present embodiment. For details, refer to the definition or description of the corresponding parts of the previous embodiments.

Figure 6:
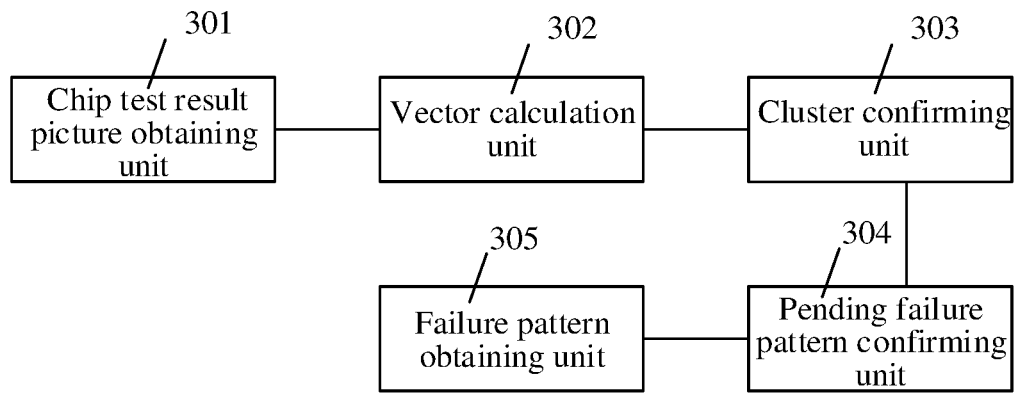
FIG. 6 is a schematic structural diagram of a failure pattern obtaining apparatus according to an embodiment of the present invention.

An embodiment of the present invention further provides a failure pattern obtaining apparatus. Referring to FIG. 6, the failure pattern obtaining apparatus 300 includes a chip test result picture obtaining unit 301, a vector calculation unit 302, a group confirming unit 303, a pending failure pattern confirming unit 304 and a failure pattern obtaining unit 305.

The chip test result picture obtaining unit 301 is configured to obtain a chip test result picture for a wafer, the chip test result picture being marked with a plurality of failure test points.

The vector calculation unit 302 is configured to calculate a vector for every two points among all of the failure test points.

The group confirming unit 303 is configured to designate a plurality of failure test points having a same vector as a same group.

The pending failure pattern confirming unit 304 is configured to separate a plurality of pending failure patterns from each of the groups.

The failure pattern obtaining unit 305 is configured to obtain a failure pattern based on the plurality of the pending failure patterns.

The wafer has a plurality of chips, each of the chips having a plurality of memory addresses, and one of the chips having a respective chip test result picture.

In an embodiment, the chip test result picture obtaining unit 301 is configured to obtain the test result picture by: performing electrical performance test on each of the memory addresses in the chip to obtain a plurality of electrical test results; and obtaining a row-column arranged picture by arranging the plurality of the electrical test results according to the memory addresses. The row-column arranged picture is the chip test result picture, and one of the failure test points in the chip test result picture corresponds to one memory address.

In another embodiment, the chip test result picture obtaining unit 301 is configured to obtain the test result picture by: performing electrical performance test on each of the memory addresses in the chip to obtain a plurality of electrical test results; obtaining a row-column arranged picture by arranging the plurality of the electrical test results according to the memory addresses; and performing compression on the row-column arranged picture to obtain a compressed picture. The compressed picture is the chip test result picture, and one of the failure test points in the chip test result picture corresponds to multiple memory addresses.

In an embodiment, the compression is performed by compressing multiple adjacent electrical test results in the row-column arranged picture into a point, where if one of the multiple electrical test results is a failure, a point formed after the compression is a failure test point.

The vector is a two-dimensional coordinate vector or a polar coordinate vector.

The group confirming unit 303 is configured to separate the plurality of pending failure patterns from each of the groups by using a clustering algorithm.

In an embodiment, the failure pattern obtaining unit 305 is configured to obtain the failure pattern by: calculating a number of occurrences times for each of the plurality of the pending failure patterns; sorting the plurality of the pending failure patterns according to the number of the occurrence times from large to small; and taking one or more pending failure patterns whose number of occurrence times is greater than or equal to 2 in the chip test result picture as the failure pattern, or taking one or more pending failure patterns whose number of occurrence times are sorted in the top 40% as the failure pattern.

In an embodiment, the vector calculation unit 302 may include a decentralized operation server configured with a pattern processor.

It should be noted that the definition or description of the same or similar parts of the present embodiment (a failure pattern obtaining apparatus) and the foregoing embodiment (a failure pattern obtaining method) will not be described in detail in the present embodiment. For details, reference is made to the definition or description of the corresponding parts of the foregoing embodiment.

Figure 7:
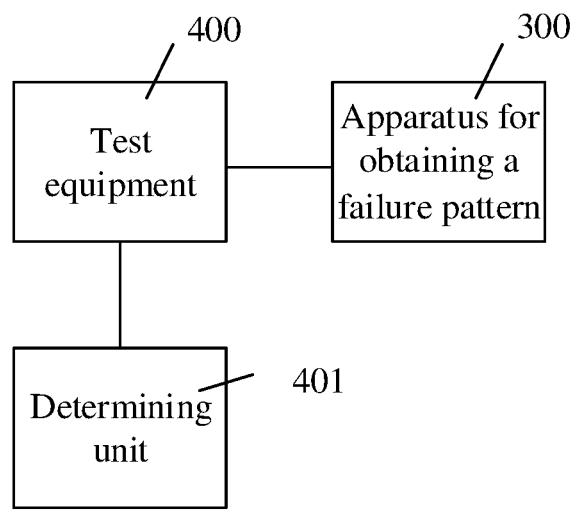
FIG. 7 is a schematic diagram of a system for monitoring test equipment according to an embodiment of the present invention.

An embodiment of the present invention further provides a system for monitoring testing equipment. Referring to FIG. 7, the system includes the forgoing failure pattern obtaining apparatus 300, test equipment 400 and a determining unit 401.

The failure pattern obtaining apparatus 300 is configured to obtain a failure pattern.

The test equipment 400 is configured to perform electrical performance test on each memory address of a to-be-tested chip of a to-be-tested wafer to obtain a chip test result picture corresponding to the to-be-tested chip.

The determining unit 401 is configured to determine whether a failure pattern exists on the chip test result picture corresponding to the to-be-tested chip, and check the test environment of the test equipment if the failure pattern exists.

In a specific embodiment, the determining unit 401 and the failure pattern obtaining apparatus 300 may be integrated in the test equipment 400.

In one embodiment, the determining unit 401 is configured to determine whether a failure pattern exists on the chip test result picture corresponding to the to-be-tested chip by matching the pattern on the chip test result picture corresponding to the to-be-tested chip with the failure pattern.

The test environment includes a test program.

The operation that the test environment of the test equipment is checked includes that the test program is modified.

Although the present invention has been disclosed as above in the preferred embodiments, they are not intended to limit the invention, and any person skilled in the art can make various modifications and changes of the invention using the methods and technical content disclosed above without departing from the spirit and scope of the present invention. Therefore, any content that does not deviate the technical solution of the present invention, any simple modifications, equivalent changes and modifications made to the above embodiments based on the technical essence of the present invention, all belong to the protection scope of the technical solution of the present invention.

The invention claimed is:

1. A failure pattern obtaining method, comprising:
    obtaining a chip test result picture for a wafer, the chip test result picture being marked with a plurality of failure test points;
    calculating a vector for every two points among all of the failure test points;
    designating a plurality of failure test points having a same vector as a same group and obtaining a plurality of groups;
    separating a plurality of pending failure patterns from each of the groups; and
    obtaining a failure pattern based on the plurality of the pending failure patterns.

2. The failure pattern obtaining method according to claim 1, wherein the wafer has a plurality of chips, each of the chips having a plurality of memory addresses, and one of the chips having a respective chip test result picture.

3. The failure pattern obtaining method according to claim 2, wherein obtaining the chip test result picture comprises:
    performing electrical performance test on each of the memory addresses in the chip to obtain a plurality of electrical test results; and
    obtaining a row-column arranged picture by arranging the plurality of the electrical test results according to the memory addresses,
    wherein the row-column arranged picture is the chip test result picture, and one of the failure test points in the chip test result picture corresponds to one memory address.

4. The failure pattern obtaining method according to claim 2, wherein obtaining the chip test result picture comprises:
    performing electrical performance test result on each of the memory addresses in the chip to obtain a plurality of electrical test results;
    obtaining a row-column arranged picture by arranging the plurality of the electrical test results according to the memory addresses; and
    performing compression on the row-column arranged picture to obtain a compressed picture,
    wherein the compressed picture is the chip test result picture, and one of the failure test points in the chip test result picture corresponds to multiple memory addresses.

5. The failure pattern obtaining method according to claim 4, wherein the compression is performed by: compressing multiple adjacent electrical test results in the row-column arranged picture into a point, wherein if one of the multiple adjacent electrical test results is a failure, a point formed after the compression is a failure test point.

6. The failure pattern obtaining method according to claim 1, wherein the vector is a two-dimensional coordinate vector or a polar coordinate vector.

7. The failure pattern obtaining method according to claim 1, wherein the vector is calculated by using a decentralized operation server configured with a pattern processor.

8. The failure pattern obtaining method according to claim 1, wherein separating the plurality of pending failure patterns from each of the groups comprises: separating the plurality of pending failure patterns from each of the groups by using a clustering algorithm.

9. The failure pattern obtaining method according to claim 1, wherein obtaining the failure pattern based on the plurality of pending failure patterns comprises:
calculating a number of occurrence times for each of the plurality of the pending failure patterns;
sorting the plurality of the pending failure patterns according to the number of the occurrence times from large to small; and
taking one or more pending failure patterns whose number of occurrence times is greater than or equal to 2 in the chip test result picture as the failure pattern, or taking one or more pending failure patterns whose number of occurrence times are sorted in the top 40% as the failure pattern.

10. The failure pattern obtaining method according to claim 1, further comprising:
after obtaining the failure pattern, checking a test environment of a respective test equipment, the test environment comprising a test program.

11. A failure pattern obtaining apparatus, comprising:
a processor; and
a memory configured to store instructions executed by the processor,
wherein the processor is configured to:
obtain a chip test result picture for a wafer, the chip test result picture being marked with a plurality of failure test points;
calculate a vector for every two points among all of the failure test points;
designate a plurality of failure test points having a same vector as a same group and obtain a plurality of groups;
separate a plurality of pending failure patterns from each of groups; and
obtain a failure pattern based on the plurality of the pending failure patterns.

12. The failure pattern obtaining apparatus according to claim 11, wherein the wafer has a plurality of chips, each of the chips having a plurality of memory addresses, and one of the chips having a respective chip test result picture.

13. The failure pattern obtaining apparatus according to claim 12, wherein the processor is specifically configured to:
perform electrical performance test on each of the memory addresses in the chip to obtain a plurality of electrical test results; and
obtain a row-column arranged picture by arranging the plurality of the electrical test results according to the memory addresses,
wherein the row-column arranged picture is the chip test result picture, and one of the failure test points in the chip test result picture corresponds to one memory address.

14. The failure pattern obtaining apparatus according to claim 12, wherein the processor is specifically configured to:
perform electrical performance test on each of the memory addresses in the chip to obtain a plurality of electrical test results;
obtain a row-column arranged picture by arranging the plurality of the electrical test results according to the memory addresses; and
perform compression on the row-column arranged picture to obtain a compressed picture,
wherein the compressed picture is the chip test result picture, and one of the failure test points in the chip test result picture corresponds to multiple memory addresses.

15. The failure pattern obtaining apparatus according to claim 14, wherein the compression is performed by compressing multiple adjacent electrical test results in the row-column arranged picture into a point, wherein if one of the multiple adjacent electrical test results is a failure, a point formed after the compression is a failure test point.

16. The failure pattern obtaining apparatus according to claim 11, wherein the vector is a two-dimensional coordinate vector or a polar coordinate vector.

17. The failure pattern obtaining apparatus according to claim 11, wherein the vector is calculated by using a decentralized operation server configured with a pattern processor.

18. The failure pattern obtaining apparatus according to claim 13, wherein the processor is specifically configured to separate the plurality of pending failure patterns from each of the groups by using a clustering algorithm.

19. The failure pattern obtaining apparatus according to claim 13, wherein the processor is specifically configured to:
calculate a number of occurrences times for each of the plurality of the pending failure patterns;
sort the plurality of the pending failure patterns according to the number of the occurrence times from large to small; and
take one or more pending failure patterns whose number of occurrence times is greater than or equal to 2 in the chip test result picture as the failure pattern, or take one or more pending failure patterns whose number of occurrence times are sorted in the top 40% as the failure pattern.

20. A system for monitoring test equipment, comprising:
a failure pattern obtaining apparatus, configured to obtain a failure pattern by the following operations:
obtaining a chip test result picture for a wafer, the chip test result picture being marked with a plurality of failure test points;
calculating a vector for every two points among all of the failure test points;
designating a plurality of failure test points having a same vector as a same group and obtaining a plurality of groups;
separating a plurality of pending failure patterns from each of the groups; and
obtaining the failure pattern based on the plurality of the pending failure patterns; and
test equipment, configured to determine whether a failure pattern exists on the chip test result picture, and check a test environment of the test equipment responsive to determining that the failure pattern exists on the chip test result picture.

* * * * *